(12) United States Patent
Kimura

(10) Patent No.: US 11,211,915 B2
(45) Date of Patent: Dec. 28, 2021

(54) ELASTIC WAVE DEVICE

(71) Applicant: Murata Manufacturing Co., Ltd., Nagaokakyo (JP)

(72) Inventor: Tetsuya Kimura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 830 days.

(21) Appl. No.: 16/026,126

(22) Filed: Jul. 3, 2018

(65) Prior Publication Data

US 2019/0068161 A1  Feb. 28, 2019

(30) Foreign Application Priority Data

Aug. 24, 2017  (JP) .............................. JP2017-161267

(51) Int. Cl.
| | |
|---|---|
| *H03H 9/02* | (2006.01) |
| *H03H 9/05* | (2006.01) |
| *H03H 9/145* | (2006.01) |
| *H03H 9/25* | (2006.01) |
| *H01L 41/047* | (2006.01) |

(52) U.S. Cl.
CPC ...... *H03H 9/0561* (2013.01); *H03H 9/02559* (2013.01); *H03H 9/02574* (2013.01); *H03H 9/02582* (2013.01); *H03H 9/02637* (2013.01); *H03H 9/02866* (2013.01); *H03H 9/145* (2013.01); *H03H 9/25* (2013.01); *H01L 41/0477* (2013.01)

(58) Field of Classification Search
CPC . H03H 9/02559; H03H 9/02637; H03H 9/145
USPC ...... 310/313 R, 313 A, 313 B, 313 C, 313 D
See application file for complete search history.

(56) References Cited

FOREIGN PATENT DOCUMENTS

JP  2000-203822 A  7/2000

*Primary Examiner* — Derek J Rosenau
(74) *Attorney, Agent, or Firm* — Keating & Bennett, LLP

(57) ABSTRACT

An elastic wave device includes a support substrate, a polycrystalline nanodiamond layer provided directly or indirectly on the support substrate, at least one inorganic material layer provided on the polycrystalline nanodiamond layer, a piezoelectric body provided directly or indirectly on the at least one inorganic material layer, and an IDT electrode provided directly or indirectly on the piezoelectric body. The piezoelectric body propagates an elastic wave at a higher velocity than the polycrystalline nanodiamond layer propagates a bulk wave, and at a lower velocity than the at least one inorganic material layer propagates a bulk wave. The polycrystalline nanodiamond layer has a percentage of sp3 bonds of about 50% or more.

19 Claims, 12 Drawing Sheets

ELASTIC WAVE DEVICE

CROSS REFERENCE TO RELATED APPLICATIONS

This application claims the benefit of priority to Japanese Patent Application No. 2017-161267 filed on Aug. 24, 2017. The entire contents of this application are hereby incorporated herein by reference.

BACKGROUND OF THE INVENTION

1. Field of the Invention

The present invention relates to an elastic wave device that includes a piezoelectric body and an interdigital transducer (IDT) electrode stacked on a multilayer body including a support substrate.

2. Description of the Related Art

In elastic wave devices, diamond-based materials have been used to reduce propagation loss. For example, in Japanese Unexamined Patent Application Publication No. 2000-203822, a hard carbon film is used that is a composite of graphitic diamond and carbon clusters. A piezoelectric layer is provided on the hard carbon film.

With such a composite, however, the resulting elastic wave device does not have good resonance characteristics.

SUMMARY OF THE INVENTION

Preferred embodiments of the present invention provide elastic wave devices that each include a diamond-base material and have good electrical properties, such as resonance characteristics and filter characteristics.

According to a preferred embodiment of the present invention, an elastic wave device includes a support substrate, a polycrystalline nanodiamond layer provided directly or indirectly on the support substrate, at least one inorganic material layer provided on the polycrystalline nanodiamond layer, a piezoelectric body provided directly or indirectly on the at least one inorganic material layer, and an IDT electrode provided directly or indirectly on the piezoelectric body. The piezoelectric body propagates an elastic wave at a higher velocity than the polycrystalline nanodiamond layer propagates a bulk wave, and at a lower velocity than the at least one inorganic material layer propagates a bulk wave. The polycrystalline nanodiamond layer has a percentage of sp3 bonds of about 50% or more.

In a preferred embodiment of the present invention, the polycrystalline nanodiamond layer preferably has an average grain diameter of about 100 nm or less.

In an elastic wave device according to a preferred embodiment of the present invention, the polycrystalline nanodiamond layer preferably has a thickness of about $0.1\lambda$ or more and less than about $0.5\lambda$, where $\lambda$ is the wavelength, which is determined by the finger pitch of the IDT electrode. Due to the polycrystalline nanodiamond layer being as thin as less than about $0.5\lambda$, the elastic wave device is thin. The thinness of the polycrystalline nanodiamond layer helps reduce material consumption and prevent the layer from warping during its formation.

In other particular aspects, the elastic wave devices according to preferred embodiments of the present invention further include a crystalline diamond layer on the support substrate side of the polycrystalline nanodiamond layer.

In an elastic wave device according to a preferred embodiment of the present invention, the polycrystalline nanodiamond layer includes at least one of W and Ta. Such an element relaxes the stress in the film, and prevents the polycrystalline nanodiamond layer from cracking.

An elastic wave device according to a preferred embodiment of the present invention utilizes an S0 plate wave propagating in the piezoelectric body.

An elastic wave device according to a preferred embodiment of the present invention includes a support substrate, a high-acoustic-impedance layer provided directly or indirectly on the support substrate and having a relatively high acoustic impedance, a low-acoustic-impedance layer provided on the high-acoustic-impedance layer and having a relatively low acoustic impedance, a piezoelectric body provided directly or indirectly on the low-acoustic-impedance layer, and an IDT electrode provided directly or indirectly on the piezoelectric body. The high-acoustic-impedance layer is a polycrystalline nanodiamond layer having a percentage of sp3 bonds of about 50% or more. The elastic wave device utilizes an S0 plate wave propagating in the piezoelectric body.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention are described below with reference to the drawings to make the present invention clearly understood.

It is to be noted that the preferred embodiments set forth herein are illustrative and partial replacement or combination of the structures and configurations between different preferred embodiments is possible.

Figure 1:
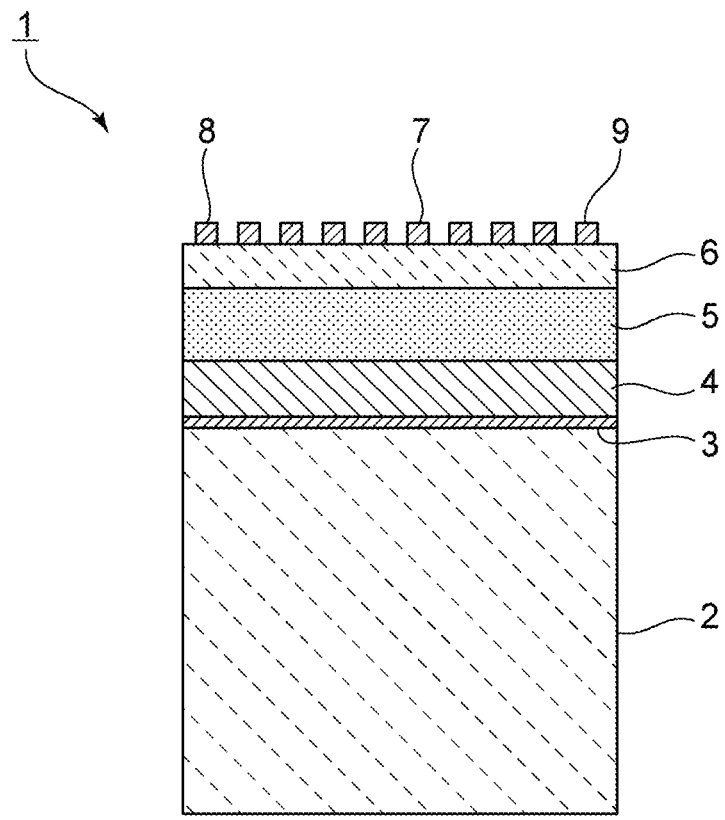
FIG. 1 is a front cross-sectional view of an elastic wave device according to Preferred Embodiment 1 of the present invention.
Figure 2:
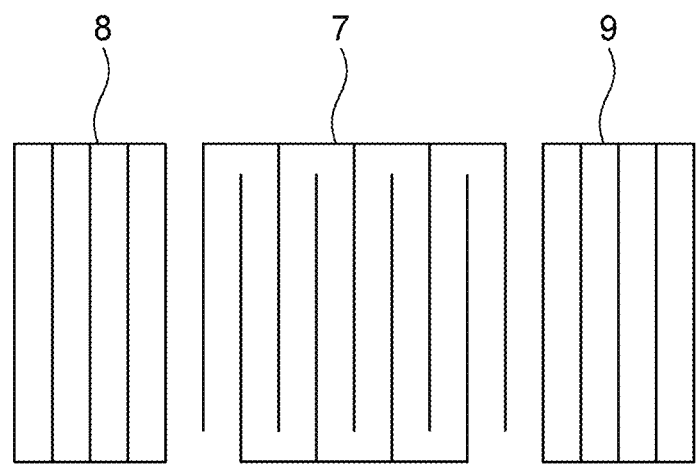
FIG. 2 is a schematic plan view of the electrode structure of the elastic wave device according to Preferred Embodiment 1 of the present invention.

FIG. 1 is a front cross-sectional view of an elastic wave device according to Preferred Embodiment 1 of the present invention. FIG. 2 is a schematic plan view of the electrode structure of the device.

The elastic wave device 1 is preferably a one-port surface acoustic wave resonator, for example. The elastic wave device 1 includes a support substrate 2. The support substrate 2 is preferably primarily Si (silicon), for example, although this is not the only possible material and other insulating or semiconductor materials may also be used.

On the support substrate 2 a crystalline diamond layer 3 and a polycrystalline nanodiamond layer 4 are stacked in this order. The polycrystalline nanodiamond layer 4 preferably has a percentage of sp3 bonds of, for example, about 50% or more.

In the elastic wave device 1, the polycrystalline nanodiamond layer 4 propagates bulk waves at a higher velocity than the piezoelectric body 6, discussed hereinafter, propagates elastic waves. The percentage of sp3 bonds in the polycrystalline nanodiamond layer 4 is about 50% or more, and more preferably about 65% or more, for example. The elastic wave device 1 exhibits good resonance characteristics as a result of the percentage of sp3 bonds being about 50% or more, and is better in resonance characteristics when this percentage of sp3 bonds is about 65% or more.

The polycrystalline nanodiamond layer 4 preferably has a polycrystalline structure in which the average grain diameter is about 100 nm or less, for example.

The crystalline diamond layer 3 is an underlayer for the polycrystalline nanodiamond layer 4. It is therefore preferable that the polycrystalline nanodiamond layer 4 is provided on the support substrate 2 with the crystalline diamond layer 3 provided as an underlayer. Since the crystalline diamond layer 3 is made of crystal grains larger than those in the polycrystalline nanodiamond layer 4 and therefore restrictive to electron movement, although optional, the crystalline diamond layer 3 improves IMD characteristics.

A dielectric layer 5 as the at least one inorganic material layer is provided on the polycrystalline nanodiamond layer 4. The dielectric layer 5 propagates bulk waves at a lower velocity than the piezoelectric layer 6 propagates elastic waves, discussed hereinafter. In the present preferred embodiment, the dielectric layer 5 is preferably a layer of silicon oxide, for example.

With a dielectric layer 5 that propagates bulk waves at a lower velocity than elastic waves that propagate in the piezoelectric body 6 provided on a polycrystalline nanodiamond layer 4 that propagates bulk waves at a higher velocity than the elastic waves that propagate in the piezoelectric body 6, the elastic wave device 1 confines sufficient energy of elastic waves to the piezoelectric body 6.

As long as this relationship between acoustic velocities is satisfied, the dielectric layer 5 may be made of any material. Silicon oxide is not the only possible material and other materials, such as silicon oxide nitride, alumina, and silicon nitride, for example, may also be used. A stack of multiple dielectric layers may also be provided. With this multilayer structure in the elastic wave device 1, a dielectric layer 5 provided on one polycrystalline nanodiamond layer 4, may be repeated.

A piezoelectric body 6 that is a thin piezoelectric film is provided on the dielectric layer 5. In the present preferred embodiment, the piezoelectric body 6 is preferably a $LiNbO_3$ having Euler angles of about (90°, 90°, 40°), for example. A $LiNbO_3$ having Euler angles of about (90°, 90°, 40°) excites surface acoustic waves with a predominant longitudinal component. The piezoelectric body 6 may be provided indirectly on the dielectric layer 5, for example.

In the present preferred embodiment, the piezoelectric body 6 may be made of any material, and its crystallographic orientation is not critical. For example, a $LiNbO_3$ with a different crystallographic orientation may be used. The piezoelectric body 6 may be $LiTaO_3$, such as a piezoelectric body that excites surface acoustic waves with a predominant SH component like an about (0°, 140°, 0°) $LiTaO_3$, for example.

An IDT electrode 7 and reflectors 8 and 9 are provided on the piezoelectric body 6. The IDT electrode 7 and reflectors 8 and 9 are preferably made of Al, for example. Al, however, is not the only possible material for them and other metals, such as, for example, Cu, W, Pt, Mo, and Ag, and alloys that are primarily any such metal may also be used. The IDT electrode 7 and reflectors 8 and 9 may be provided indirectly on the piezoelectric body 6, for example, with a silicon oxide film therebetween.

The IDT electrode 7 and reflectors 8 and 9 may be multilayer bodies each including multiple metal films. In this case, there may preferably be a metal layer, for example, of Ti, Ni, or NiCr, to provide close contact, or a Ti or Ni layer to prevent diffusion.

The IDT electrode 7 and reflectors 8 and 9, moreover, may preferably be partially or completely covered with a frequency tuning film and/or a protective film, for example.

The elastic wave device 1 incorporates a piezoelectric body 6 that is a $LiNbO_3$ having the crystallographic orientation specified above, and utilizes an S0 plate wave propagating in the piezoelectric body 6. The elastic wave device 1 is a one-port elastic wave resonator that utilizes this S0 plate wave.

The elastic wave device 1 includes a support substrate 2, a polycrystalline nanodiamond layer 4 provided directly or indirectly on the support substrate 2, at least one inorganic material layer 5 provided on the polycrystalline nanodiamond layer 4, a piezoelectric body 4 provided directly or indirectly on the at least one inorganic material layer 5, and an IDT electrode 7 provided directly or indirectly on the piezoelectric body 6, the piezoelectric body 6 propagates elastic waves at a higher velocity than the polycrystalline nanodiamond layer 4 propagates bulk waves, and at a lower velocity than the at least one inorganic material layer 5 propagates bulk waves, and the polycrystalline nanodiamond layer 4 has a percentage of sp3 bonds of about 50% or more, for example. A range of elastic wave devices have been proposed that incorporate various diamond materials beneath a piezoelectric body, but were unable to achieve good resonance characteristics and filter characteristics.

The elastic wave device 1, by contrast, has good resonance characteristics, due to a particular polycrystalline nanodiamond layer 4 in which the percentage of sp3 bonds is about 50% or more, for example. The following discusses this in further detail with reference to FIGS. 3 to 14.

Figure 3:
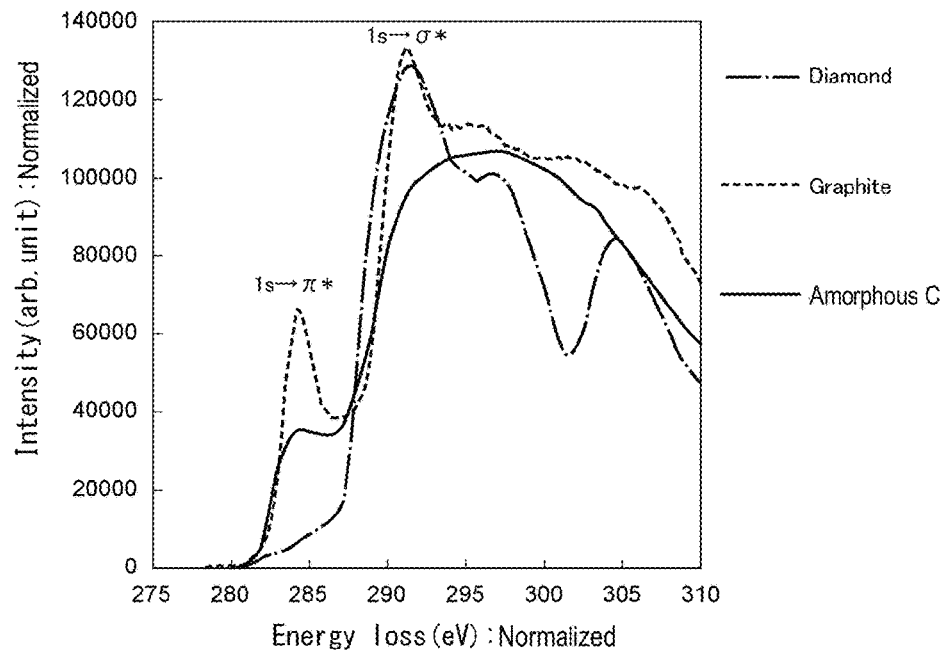
FIG. 3 shows the results of a TEM-EELS analysis of carbon in polycrystalline nanodiamond, graphite, and amorphous carbon.

On a Si substrate as the support substrate 2, a crystalline diamond layer 3 and a polycrystalline nanodiamond layer 4 were formed by hot-filament deposition. The conditions were as follows: methane concentration, about 1% by volume; methane flow rate passage, about 50 sccm; pressure, about 10 Torr; filament temperature, about 2000° C.; support substrate 2 heating temperature, about 650° C. This produced an about 400-nm diamond film including an about 300-nm thick polycrystalline nanodiamond layer 4 and an about 100-nm thick underlying crystalline diamond layer 3. The polycrystalline nanodiamond layer 4 was analyzed by TEM-EELS for carbon contained therein. FIG. 3 shows the results. In FIG. 3, the long and short dashed line indicates the results for the polycrystalline nanodiamond layer 4, the broken line indicates the results for graphite as a comparative example, and the solid line indicates the results for amorphous carbon as a comparative example.

TEM-EELS, performed using a system that combines transmission electron microscopy (TEM) with electron energy-loss spectroscopy (EELS), is an analytical process that provides information about the composition, structure, electronic properties, and other characteristics of the analyte with high spatial resolution.

As illustrated in FIG. 3, graphite and amorphous carbon presented two peaks, 1s→π* and 1s→σ*. The 1s→π* peak is from the sp2 bond.

Polycrystalline nanodiamond, by contrast, only presented the 1s→σ* peak, a peak from the sp3 bond.

Figure 4:
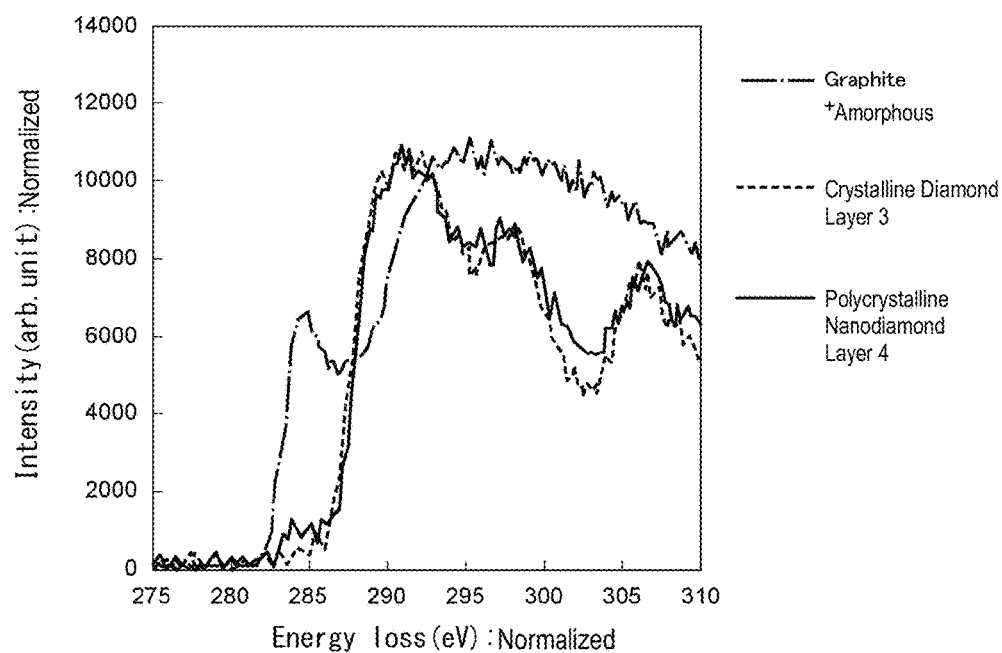
FIG. 4 shows the EELS spectrum of polycrystalline nanodiamond and crystalline diamond layers obtained in an experiment of Preferred Embodiment 1 of the present invention, along with that of amorphous graphite as a comparative example.

FIG. 4 shows the results of a TEM-EELS carbon analysis of the polycrystalline nanodiamond layer 4 and crystalline diamond layer 3 obtained in the above experiment, along with those of graphite as a comparative example.

The solid line indicates the results for the polycrystalline nanodiamond layer 4, the broken line indicates the results for the crystalline diamond layer 3, and the long and short dashed line indicates the results for graphite.

As is clear from FIG. 4, in both of the polycrystalline nanodiamond layer 4 and crystalline diamond layer 3, the sp3 bond was predominant. The polycrystalline nanodiamond layer 4 in this experiment had a small percentage of sp2 bonds as suggested by the minor peak near 285 eV, but from FIG. 4, it is understood that the polycrystalline nanodiamond layer 4 had a percentage of sp3 bonds of about 95%.

In this experiment, the finger pitch p of the IDT electrode 7 was about 0.5 µm. The wavelength λ, determined by the finger pitch p of the IDT electrode 7, was therefore about 1.0 µm. On the polycrystalline nanodiamond layer 4, a $SiO_2$ film with a thickness of about 0.24p was provided as the dielectric layer 5. Then, a piezoelectric body 6 that was a $LiNbO_3$ with Euler angles of about (90°, 90°, 40°) was provided with a thickness of about 0.4p. The IDT electrode 7 and reflectors 8 and 9 were layers of Al provided with a thickness of about 0.12p. The thickness of the IDT electrode 7 was therefore about 0.06λ.

The elastic wave device 1 was fabricated using different conditions for the formation of the polycrystalline nanodiamond layer 4 to produce elastic wave devices 1 with different sp3 bond percentages in the polycrystalline nanodiamond layer 4. More specifically, elastic wave devices 1 were fabricated having a polycrystalline nanodiamond layer 4 with a percentage of sp3 bonds of about 22%, about 35%, about 50%, about 65%, about 85%, or about 95%. As in the experiment above, these percentages of sp3 bonds were determined by TEM-EELS carbon analysis.

By changing the above conditions for the formation of the polycrystalline nanodiamond layer 4, elastic wave devices 1 were fabricated to include a polycrystalline nanodiamond layer 4 with a percentage of sp3 bonds of about 22%, about 35%, about 50%, about 65%, about 85%, or about 95% as described above. The percentages of sp3 bonds of these elastic wave devices 1 were determined by the TEM-EELS carbon analysis described above.

FIGS. 7 to 12 illustrate the resonance characteristics of elastic wave devices 1 including a polycrystalline nanodiamond layer 4 with such a percentage of sp3 bonds.

Figure 7:
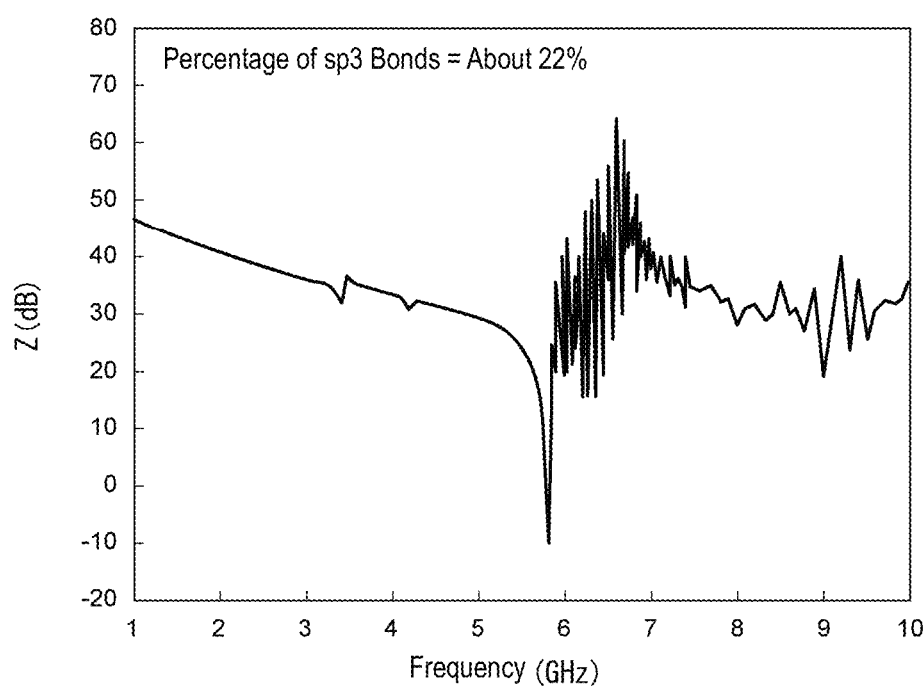
FIG. 7 illustrates the resonance characteristics of an elastic wave device with the percentage of sp3 bonds=about 22%.
Figure 8:
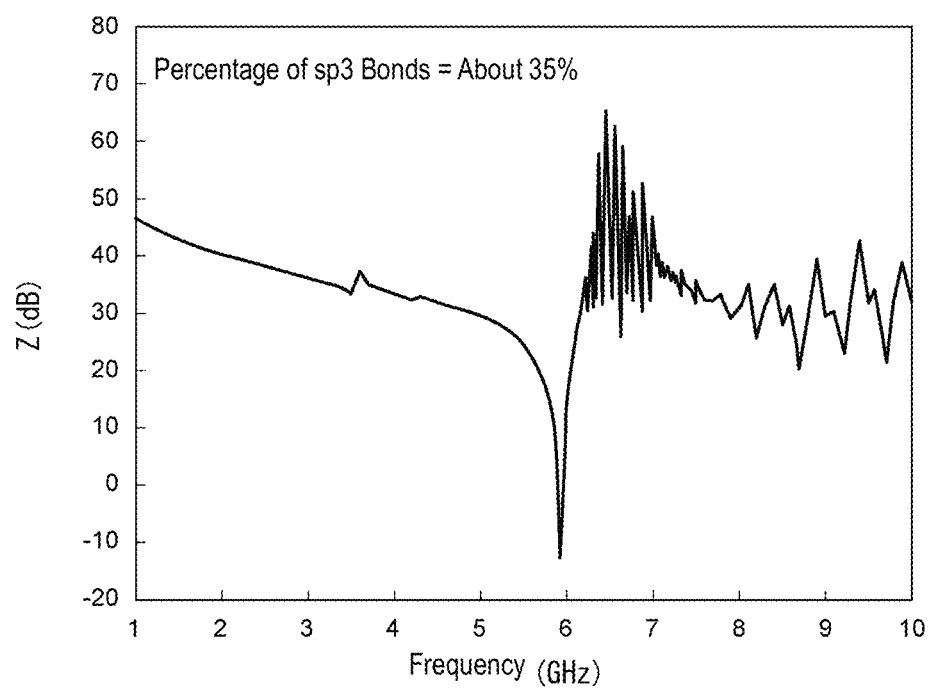
FIG. 8 illustrates the resonance characteristics of an elastic wave device with the percentage of sp3 bonds=about 35%.
Figure 9:
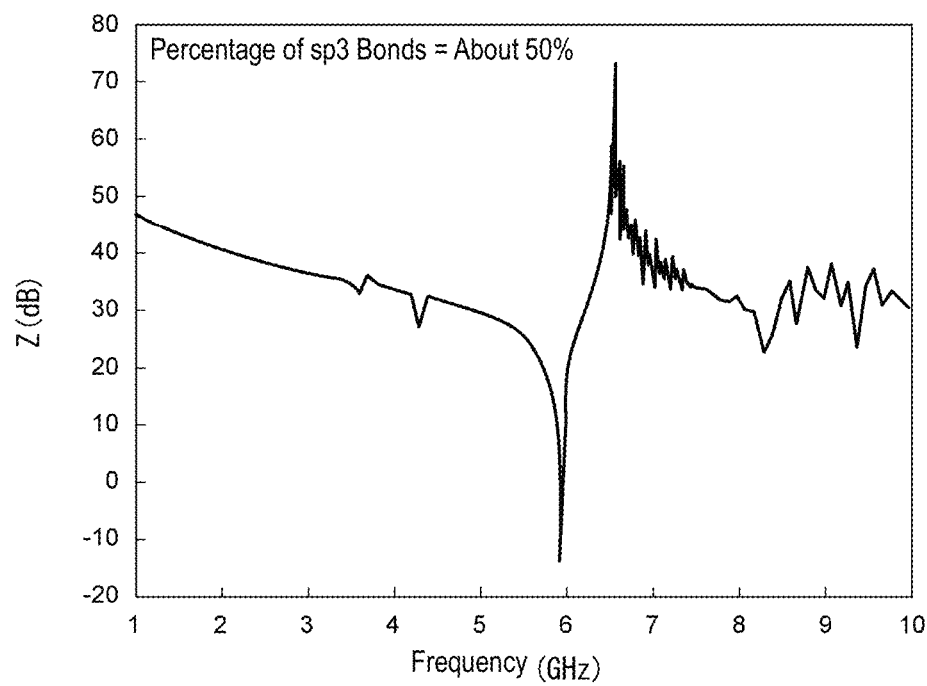
FIG. 9 illustrates the resonance characteristics of an elastic wave device with the percentage of sp3 bonds=about 50%.
Figure 10:
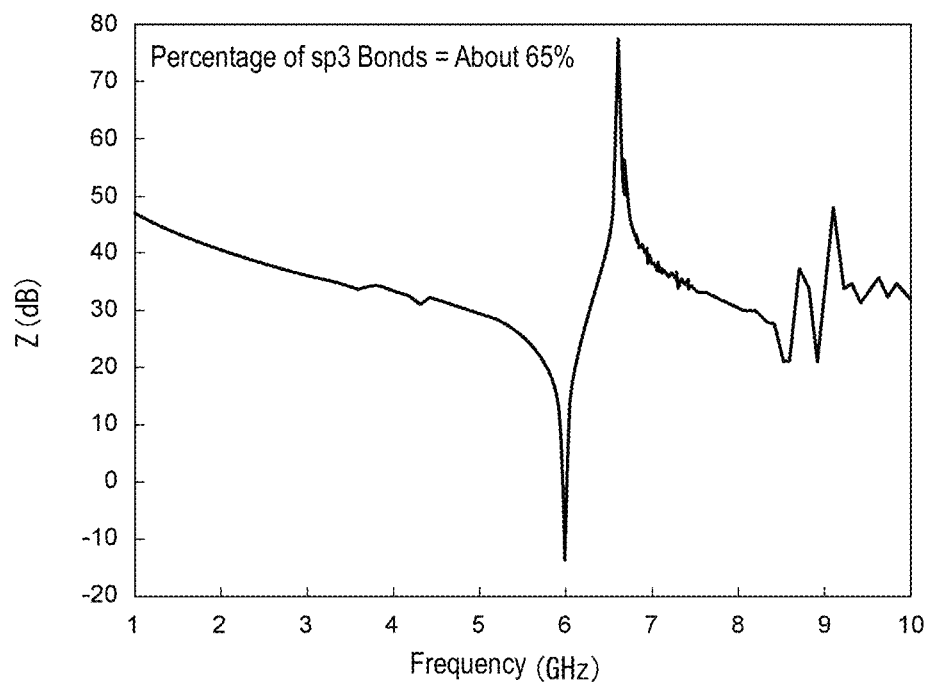
FIG. 10 illustrates the resonance characteristics of an elastic wave device with the percentage of sp3 bonds=about 65%.
Figure 11:
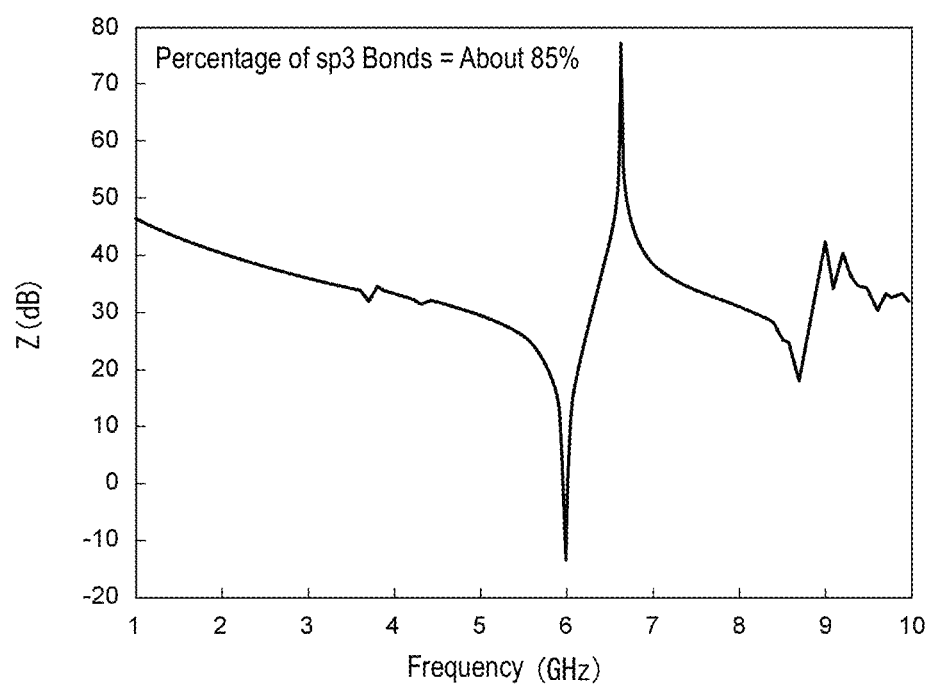
FIG. 11 illustrates the resonance characteristics of an elastic wave device with the percentage of sp3 bonds=about 85%.
Figure 12:
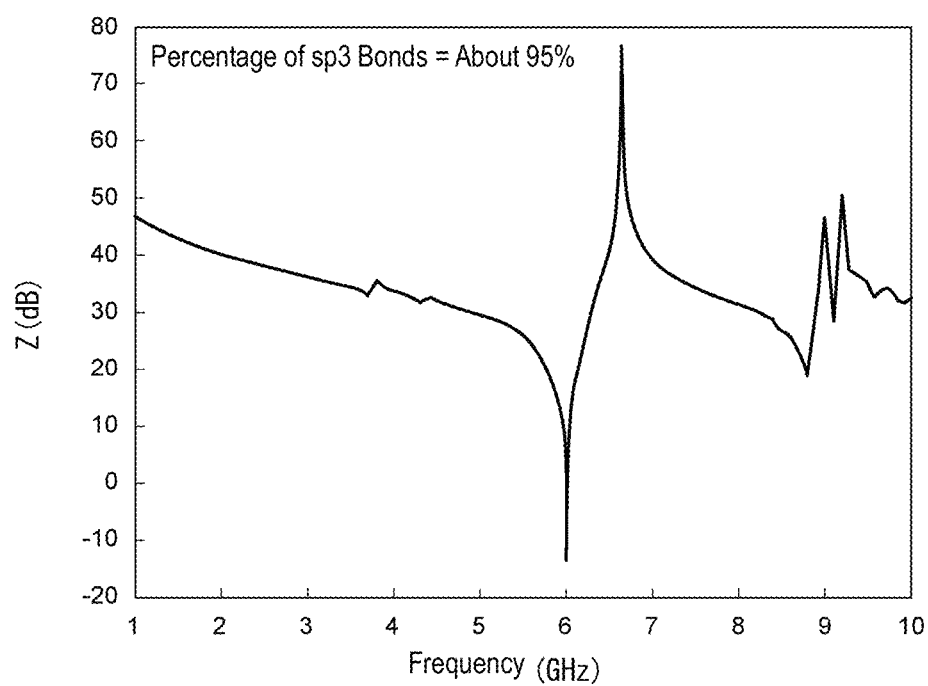
FIG. 12 illustrates the resonance characteristics of an elastic wave device with the percentage of sp3 bonds=about 95%.

As shown in FIGS. 7 and 8, sp3 bond percentages less than about 50% did not result in good resonance characteristics. In particular, the frequency band between the resonant and anti-resonant points and the vicinity of the anti-resonant point included enormous spurious emissions.

In contrast, as shown in FIGS. 9 to 12, about 50% or higher percentages of sp3 bonds resulted in good resonance characteristics. When the sp3 bond percentage was about 65% or more, the resonance characteristics were better with few spurious emissions outside the resonance point, and with a sufficiently high peak-valley ratio. When the sp3 bond percentage was about 85% or higher, very few spurious emissions were observed in the frequency band between the resonance and anti-resonance frequencies and in the vicinity of the anti-resonance frequency. This means that the percentage of sp3 bonds is more preferably about 65% or more, even more preferably about 85% or more, for example.

Figure 13:
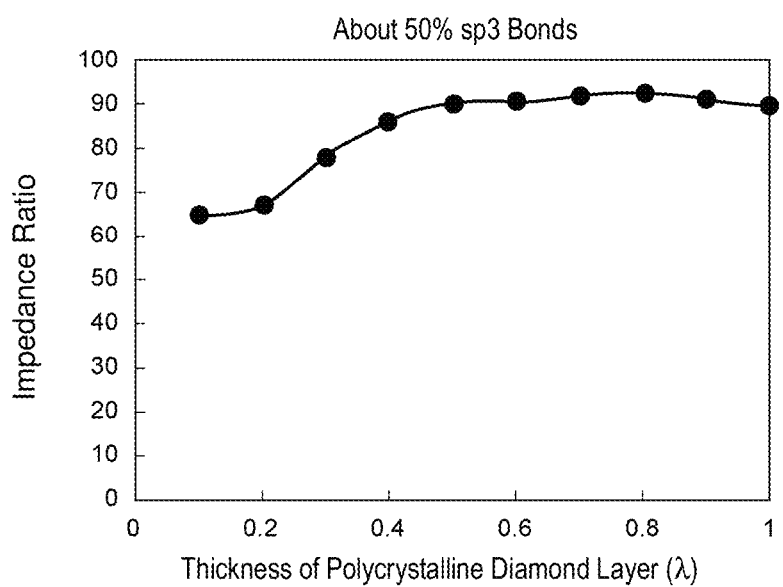
FIG. 13 illustrates the relationship between polycrystalline nanodiamond layer thickness and impedance ratio for elastic wave devices with a percentage of sp3 bonds of about 50%.

Then, elastic wave devices 1 were fabricated using polycrystalline nanodiamond layers 4 with an sp3 bond percentage of about 50% and different thicknesses, and their impedance ratio was determined. FIG. 13 presents the results.

Figure 14:
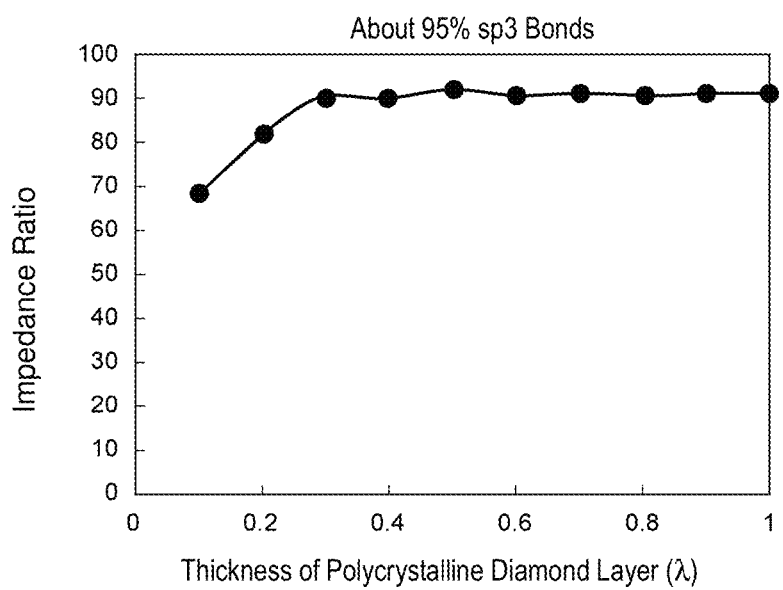
FIG. 14 illustrates the relationship between polycrystalline nanodiamond layer thickness and impedance ratio for elastic wave devices with a percentage of sp3 bonds of about 95%.

As is clear from FIG. 13, the impedance ratio is sufficiently high when the thickness of the polycrystalline nanodiamond layer 4 is about 0.4λ or more. Then similar elastic wave devices 1, varying in the thickness of the polycrystalline nanodiamond layer 4, were prepared using polycrystalline nanodiamond layers 4 having a percentage of sp3 bonds of about 95%. FIG. 14 illustrates the relationship between the thickness of the polycrystalline nanodiamond layer 4 and the impedance ratio.

As is clear from FIG. 14, when the sp3 bond percentage is about 95%, a polycrystalline nanodiamond layer 4 having a thickness of about 0.3λ or more produces a device with a sufficiently high impedance ratio of about 90 or more. Provided that the percentage of sp3 bonds is about 50% or more, therefore, it is preferable that the thickness of the polycrystalline nanodiamond layer 4 be about 0.4λ or more, for example, regardless of the sp3 bond percentage.

It should be noted that in FIGS. 13 and 14, the impedance ratio almost saturates at film thicknesses of about 0.4λ or more and about 0.3λ or more, respectively.

However, a thick polycrystalline nanodiamond layer 4 easily warps during formation, is costly to produce, and makes it difficult to fabricate a thin elastic wave device 1. If the manufacturer seeks to produce thin elastic wave devices 1 under a simplified process, a thin polycrystalline nanodiamond layer 4 is preferable.

Since thinness is preferred, it is preferably that the thickness of the polycrystalline nanodiamond layer 4 be less than about 0.5λ, for example.

There is no particular lower limit to the thickness of the polycrystalline nanodiamond layer 4. As shown in FIGS. 13 and 14, a thickness of about 0.1λ is enough for effective confinement of elastic waves and resonant characteristics.

It is therefore preferable that the thickness of the polycrystalline nanodiamond layer 4 be about 0.1λ or more and less than about 0.5λ, for example.

Figure 5:
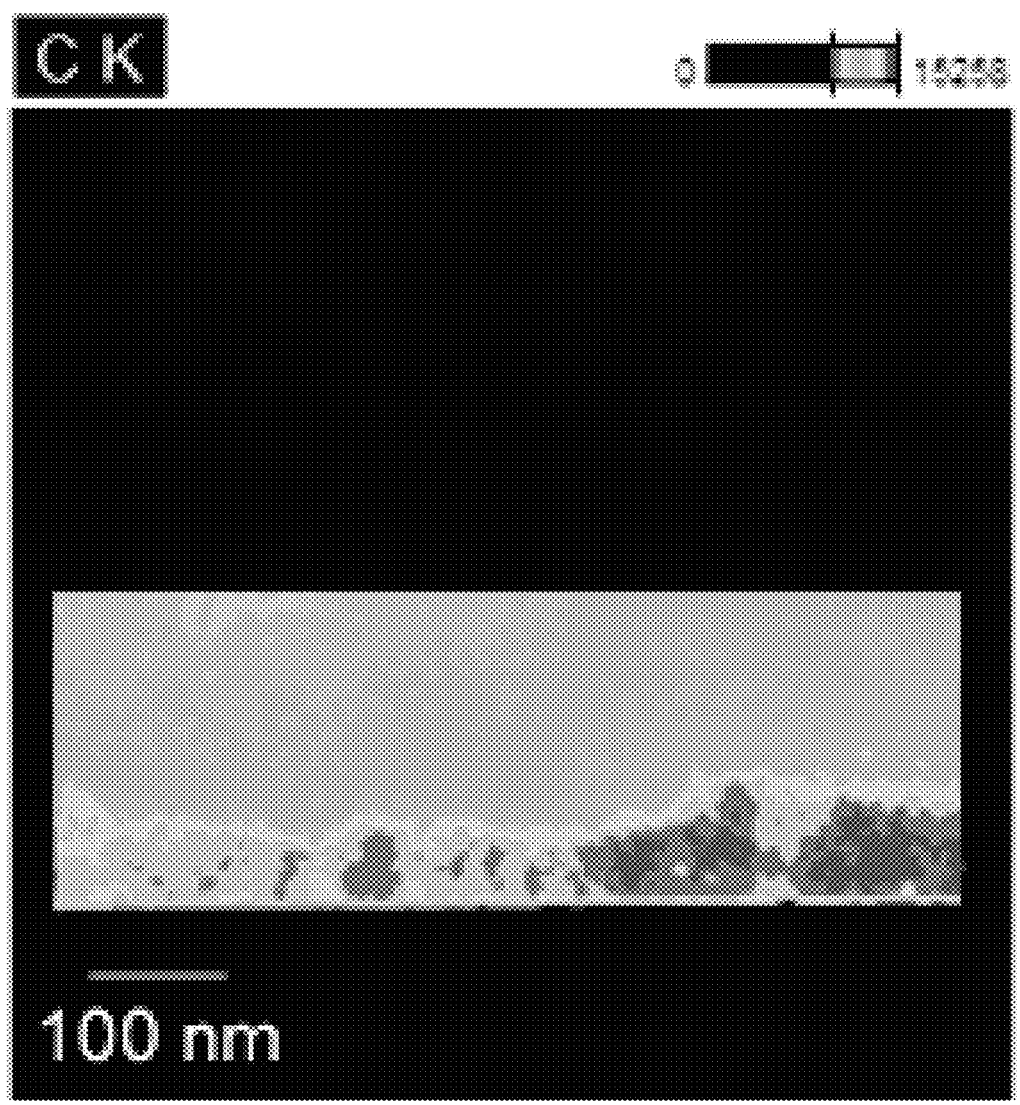
FIG. 5 is an XPS elemental map for carbon of polycrystalline nanodiamond and underlying crystalline diamond layers obtained in the experiment of Preferred Embodiment 1 of the present invention.
Figure 6:
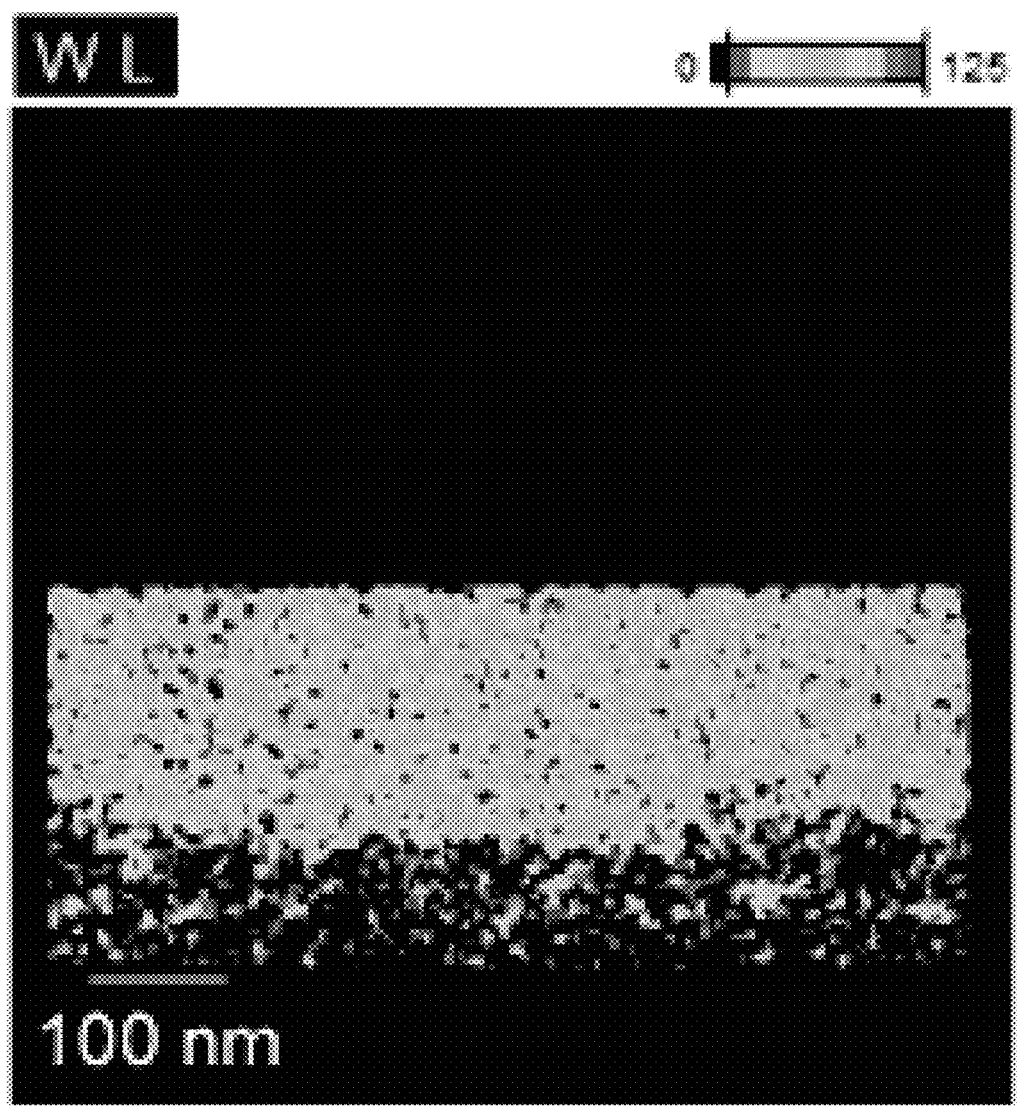
FIG. 6 is an XPS elemental map for tungsten of polycrystalline nanodiamond and underlying crystalline diamond layers obtained in the experiment of Preferred Embodiment 1 of the present invention.

FIG. 5 is an XPS elemental map for carbon of a polycrystalline nanodiamond layer 4 and a crystalline diamond layer 3 in the above experiment, and FIG. 6 is an XPS elemental map for tungsten W.

As is clear from FIG. 5, more carbon existed in the underlying crystalline diamond layer 3 than in the polycrystalline nanodiamond layer 4. As can be seen from FIG. 6, tungsten W was present in the polycrystalline nanodiamond layer 4, although in a small amount. This trace of tungsten W relaxes the stress in the film, and prevents the polycrystalline nanodiamond layer 4 from cracking during formation.

Tantalum Ta used instead of tungsten W also prevents the polycrystalline nanodiamond layer 4 from cracking during formation.

Figure 15:
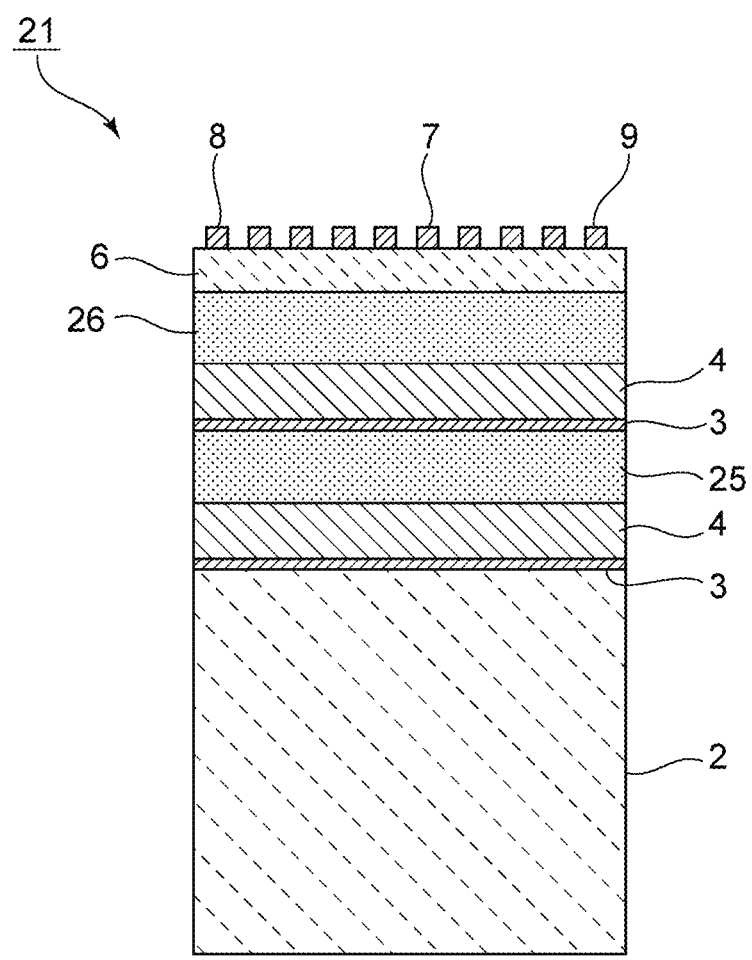
FIG. 15 is a front cross-sectional view of an elastic wave device according to Preferred Embodiment 2 of the present invention.

FIG. 15 is a front cross-sectional view of an elastic wave device 21 according to Preferred Embodiment 2 of the present invention.

The elastic wave device 21 includes low-acoustic-impedance layers 25 and 26 instead of a dielectric layer 5, illustrated in FIG. 1. The elastic wave device 21 has a multilayer structure including a crystalline diamond layer 3 and a polycrystalline nanodiamond layer 4 between the low-acoustic impedance layers 25 and 26. Except for these differences, the elastic wave device 21 has the same or substantially the same structure as the elastic wave device 1.

The low-acoustic-impedance layers 25 and 26 in the present preferred embodiment are preferably layers of silicon oxide, for example. The material for the low-acoustic-impedance layers 25 and 26 is not critical but these layers preferably have a lower acoustic impedance than the polycrystalline nanodiamond layer 4.

With the low-acoustic-impedance layers 25 and 26 stacked alternately with the polycrystalline nanodiamond layers 4 as high-acoustic-impedance layers, the elastic wave device 21 effectively confines elastic waves to the piezoelectric body 6. As can be seen from this, an elastic wave device according to a preferred embodiment of the present invention may include a multilayer acoustic film that includes multiple layers with different acoustic impedances. That is, a polycrystalline nanodiamond layer 4 may be used as a high-acoustic-impedance layer in a multilayer acoustic film.

The elastic wave device 21 includes a support substrate 2, a high-acoustic-impedance layer 4 provided directly or indirectly on the support substrate 2 and having a relatively high acoustic impedance, a low-acoustic-impedance layer 25 provided on the high-acoustic-impedance layer 4 and having a relatively low acoustic impedance, a piezoelectric body 6 provided directly or indirectly on the low-acoustic-impedance layer 25, and an IDT electrode 7 provided directly or indirectly on the piezoelectric body 6, the high-acoustic-impedance layer 4 is preferably a polycrystalline nanodiamond layer having a percentage of sp3 bonds of about 50% or more, for example. This structure provides good resonance characteristics.

The layer structure of the multilayer acoustic film is not critical, but preferably includes at least one high-acoustic-impedance layer that is a polycrystalline nanodiamond layer that has a percentage of sp3 bonds of about 50% or more and at least one low-acoustic-impedance layer, for example.

It should be understood that although Preferred Embodiments 1 and 2 described are one-port elastic wave resonators, the present invention is not limited to one-port elastic wave resonators and other preferred embodiments may be devices having a different electrode structure, such as longitudinally coupled resonator filters. Longitudinally coupled resonator filters would benefit in that they would achieve good filter characteristics.

There may be intermediate layers, for example, to provide close contact or define and function as a buffer, provided between the support substrate 2 and polycrystalline nanodiamond layer 4, between the polycrystalline nanodiamond layer 4 and dielectric layer 5, and/or between the dielectric layer 5 and piezoelectric body 6. This also applies to the elastic wave device 21 and there may be intermediate layers provided between the low-acoustic-impedance layers 25 and 26 and polycrystalline nanodiamond layers 4 and/or between the low-acoustic-impedance layer 26 and piezoelectric body 6.

The process used hereinabove to produce polycrystalline nanodiamond layers 4 is not the only possible option. A wide assortment of processes may be used, such as microwave CVD and plasma CVD, for example.

Moreover, methane, used in the above-described production process as the feedstock carbon-hydrogen gas mixture used to form the polycrystalline nanodiamond layer 4, may be replaced with, for example, butane or acetylene. Any carbon-hydrogen gas mixture may be used.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
a support substrate;
a polycrystalline nanodiamond layer provided directly or indirectly on the support substrate;
at least one inorganic material layer provided on the polycrystalline nanodiamond layer;
a piezoelectric body provided directly or indirectly on the at least one inorganic material layer; and
an IDT electrode provided directly or indirectly on the piezoelectric body; wherein
the piezoelectric body propagates an elastic wave at a higher velocity than the polycrystalline nanodiamond layer propagates a bulk wave;
the piezoelectric body propagates an elastic wave at a lower velocity than the at least one inorganic material layer propagates a bulk wave; and
the polycrystalline nanodiamond layer has a percentage of sp3 bonds of about 50% or more.

2. The elastic wave device according to claim 1, wherein the polycrystalline nanodiamond layer has an average grain diameter of about 100 nm or less.

3. The elastic wave device according to claim 1, wherein the polycrystalline nanodiamond layer has a thickness of about 0.1λ or more and less than about 0.5λ, where λ is a wavelength, which is determined by a finger pitch of the IDT electrode.

4. The elastic wave device according to claim 1, further comprising a crystalline diamond layer provided on a support substrate side of the polycrystalline nanodiamond layer.

5. The elastic wave device according to claim 1, wherein the polycrystalline nanodiamond layer includes at least one of W and Ta.

6. The elastic wave device according to claim 1, wherein the elastic wave device utilizes an S0 plate wave propagating in the piezoelectric body.

7. The elastic wave device according to claim 1, wherein the polycrystalline nanodiamond layer has a percentage of sp3 bonds of about 65% or more.

8. The elastic wave device according to claim 1, wherein the at least one inorganic material layer is made of silicon oxide.

9. The elastic wave device according to claim 1, wherein the piezoelectric body is an LiNbO$_3$ layer having Euler angles of about (90°, 90°, 40°).

10. The elastic wave device according to claim 1, wherein the IDT electrode is made of Al.

11. An elastic wave device comprising:
a support substrate;
a high-acoustic-impedance layer provided directly or indirectly on the support substrate and having a relatively high acoustic impedance;
a low-acoustic-impedance layer provided on the high-acoustic-impedance layer and having a relatively low acoustic impedance;
a piezoelectric body provided directly or indirectly on the low-acoustic-impedance layer; and
an IDT electrode provided directly or indirectly on the piezoelectric body; wherein
the high-acoustic-impedance layer is a polycrystalline nanodiamond layer having a percentage of sp3 bonds of about 50% or more.

12. The elastic wave device according to claim 11, wherein the elastic wave device utilizes an S0 plate wave propagating in the piezoelectric body.

13. The elastic wave device according to claim 11, wherein the polycrystalline nanodiamond layer has an average grain diameter of about 100 nm or less.

14. The elastic wave device according to claim 11, wherein the polycrystalline nanodiamond layer has a thickness of about 0.1λ or more and less than about 0.5λ, where λ is a wavelength, which is determined by a finger pitch of the IDT electrode.

15. The elastic wave device according to claim 11, further comprising a crystalline diamond layer provided on a support substrate side of the polycrystalline nanodiamond layer.

16. The elastic wave device according to claim 11, wherein the polycrystalline nanodiamond layer includes at least one of W and Ta.

17. The elastic wave device according to claim 11, wherein the polycrystalline nanodiamond layer has a percentage of sp3 bonds of about 65% or more.

18. The elastic wave device according to claim 11, wherein the piezoelectric body is an LiNbO$_3$ layer having Euler angles of about (90°, 90°, 40°).

19. The elastic wave device according to claim 11, wherein the IDT electrode is made of Al.

* * * * *